United States Patent
Ikeda et al.

(10) Patent No.: US 7,944,321 B2
(45) Date of Patent: May 17, 2011

(54) HARMONIC SUPPRESSING CIRCUIT

(75) Inventors: Takeshi Ikeda, Ohta-ku (JP); Hiroshi Miyagi, Yokohama (JP)

(73) Assignee: Ricoh Co., Ltd., Tokyo (JP)

( * ) Notice: Subject to any disclaimer, the term of this patent is extended or adjusted under 35 U.S.C. 154(b) by 478 days.

(21) Appl. No.: 12/161,653

(22) PCT Filed: Sep. 21, 2006

(86) PCT No.: PCT/JP2006/319223
§ 371 (c)(1),
(2), (4) Date: Jul. 21, 2008

(87) PCT Pub. No.: WO2007/083416
PCT Pub. Date: Jul. 26, 2007

(65) Prior Publication Data
US 2010/0219909 A1  Sep. 2, 2010

(30) Foreign Application Priority Data
Jan. 23, 2006  (JP) ................. 2006-013434

(51) Int. Cl.
*H03G 11/00* (2006.01)
*H03G 7/00* (2006.01)
*H04B 15/00* (2006.01)

(52) U.S. Cl. ............. 333/17.2; 333/14; 381/61; 381/98; 381/94.2; 455/114.1; 455/114.2

(58) Field of Classification Search .......... 333/17.1, 333/17.2, 17.3, 18, 14; 330/149; 455/114.1, 455/114.2; 381/61, 98, 99, 94.2; 375/296, 375/285
See application file for complete search history.

(56) References Cited

U.S. PATENT DOCUMENTS

| | | | | |
|---|---|---|---|---|
| 4,281,295 A * | 7/1981 | Nishimura et al. | ............. | 333/14 |
| 4,427,950 A * | 1/1984 | Akagiri et al. | ................. | 330/149 |
| 4,471,318 A * | 9/1984 | Akagiri | ......................... | 330/149 |
| 5,220,427 A * | 6/1993 | Mikami | ......................... | 348/678 |
| 2004/0161114 A1 * | 8/2004 | Koyanagi | ........................... | 381/1 |

FOREIGN PATENT DOCUMENTS

| | | |
|---|---|---|
| JP | 51-042748 | 10/1976 |
| JP | 59-021136 | 2/1984 |
| JP | 11-068590 | 3/1999 |

* cited by examiner

*Primary Examiner* — Benny Lee
*Assistant Examiner* — Alan Wong
(74) *Attorney, Agent, or Firm* — Connolly Bove Lodge & Hutz LLP

(57) ABSTRACT

There are included an LPF (3) and an HPF (4) that are connected in parallel to the output of a pre-emphasis circuit (2). There is also included a gain adjusting circuit (6) that performs a gain adjustment of low-pass filter with respect to the frequency band to be passed through the HPF (4). The low frequency components of the frequency band of baseband signals outputted from the pre-emphasis circuit (2) pass through the LPF (3), while the high frequency components pass through the HPF (4). As to the outputs from the HPF (4), the gain of especially the higher part of the frequency band components to be passed through the HPF (4) is suppressed by the gain adjusting circuit (6), whereby the amplitudes of the baseband signals can be limited only for the high frequency range without using a limiter and further the peak values of the baseband signals can be inhibited from exceeding the maximum frequency deviation.

1 Claim, 2 Drawing Sheets

HARMONIC SUPPRESSING CIRCUIT

This application is a national phase of PCT/JP2006/319223, filed on Sep. 21, 2006, which claims priority to JP 2006-013434, filed Jan. 23, 2006, the entire contents of all are hereby incorporated by reference.

TECHNICAL FIELD

The present invention relates to a harmonic suppressing circuit, and more particularly to one suitable for use in a circuit used to suppress occurrence of harmonics when a frequency modulator processes baseband signals.

BACKGROUND ART

In general, in order to transmit data as a radio wave signal, it is absolutely necessary to convert baseband signals (low frequency signal containing near-DC components) into high frequency radio signals; that is, modulation is indispensable. Modulation is roughly classified into three types. One is frequency modulation (FM for analog modulation, FSK for digital modulation) in which the frequency of high frequency signal is varied in proportion to baseband signals. For example, in FM radio broadcasting, signal modulation is performed using this frequency modulation before signal transmission.

In frequency modulation, as illustrated in FIG. 1, frequency deviation is determined by the instantaneous peak value of baseband signal, so a limiter circuit is commonly used for amplitude limitation so that the amplitude of baseband signal is prevented from exceeding a given value (maximum frequency deviation). However, when the amplitude of baseband signal is limited by the limiter circuit, the output of the limiter contains harmonic components. Thus, in order to eliminate the harmonic components, there is used a low-pass filter having a precipitous cutoff characteristic (for example, refer to Patent Document 1).

Patent Document 1: Japanese Patent Laid-Open No. 8-149012

FIG. 2 is a view illustrating a configuration of a baseband processing circuit used in the conventional FM modulator. Referring to FIG. 2, an amplifier 101 amplifies an input signal. A pre-emphasis circuit 102 emphasizes the signals outputted from the amplifier 101 as the frequency at the frequency band to be converted becomes higher in order to transmit signals with the higher frequency preliminarily and emphatically modulated. A limiter 103 limits the amplitude of the signal outputted from, the pre-emphasis circuit 102 to a prescribed limit value. A low-pass filter (LPF) 104 eliminates the high frequency components of the signal outputted from the limiter 103 and thereby eliminates harmonics produced in the limiter 103.

However, the output signal of the limiter 103 contains n-th (n=1, 2, . . . ) harmonics, and thus even when the LPF 104 is used, it is difficult to eliminate all these harmonics. Further, when the voltage-frequency conversion characteristic of the FM modulator is not linear, the high frequency components which is expected to have been eliminated, by the LPF 104 appear in the modulation output signal, thus spreading the spectrum. Further, when the LPF 104 having a precipitous cutoff characteristic is used, there occurs phase distortion, i.e., group delay in which delay time varies for each frequency of the input signal.

It is noted here that, as indicated by the dashed-dotted line of FIG. 1, when the amplitude of baseband signal is controlled small, the peak value is prevented from exceeding the maximum frequency deviation. In this case, there is no need to use the limiter which causes occurrence of harmonics. However, when the amplitude of baseband signal is reduced in this way over the entire frequency range thereof, the average sound level decreases, reducing the sound of radio broadcasting or the like to be heard. Thus, this method is not preferable.

SUMMARY OF THE INVENTION

To address the above problem, the present invention has been devised and has an object to effectively suppress occurrence of harmonic components without reducing the amplitude of baseband signal over the entire frequency range.

To address the above problem, the present invention includes: a low-pass filter and a high-pass filter that are connected in parallel to the output of a pre-emphasis circuit; an adder circuit that adds the output signals of the two filters and outputs the resultant signal; and a gain adjusting circuit that performs gain adjustment so that the gain of the higher part of the frequency band components to be passed through the high-pass filter is low while the gain of the lower part, thereof is high.

According to the present invention having the above configuration, the low frequency components of the frequency band of baseband signal outputted from the pre-emphasis circuit pass through the low-pass filter while the high frequency components thereof pass through the high-pass filter. In this ease, as to the outputs from the high-pass filter, the gain of the higher part of the frequency band components to be passed through the high-pass filter is suppressed by the gain adjusting circuit. Thus, the peak value of baseband signal can be prevented, without using a limiter, from exceeding the maximum frequency deviation and it is thus possible to effectively suppress occurrence of harmonics. Further, the amplitude of baseband signal is suppressed not over the entire frequency range thereof but only for the high frequency range, so it is also possible to avoid the inconvenience of lowering the level of signal over the entire frequency range.

BEST MODE FOR CARRYING OUT THE INVENTION

Figure 1:
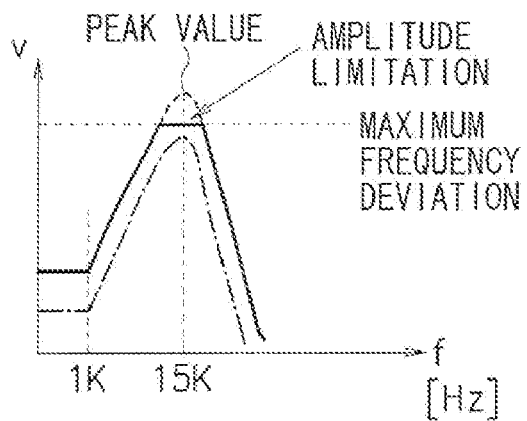
FIG. 1 is a view illustrating the prior art baseband signal frequency characteristics.
Figure 2:
FIG. 2 is a view illustrating an exemplary configuration of the prior art baseband processing circuit.
Figure 3:
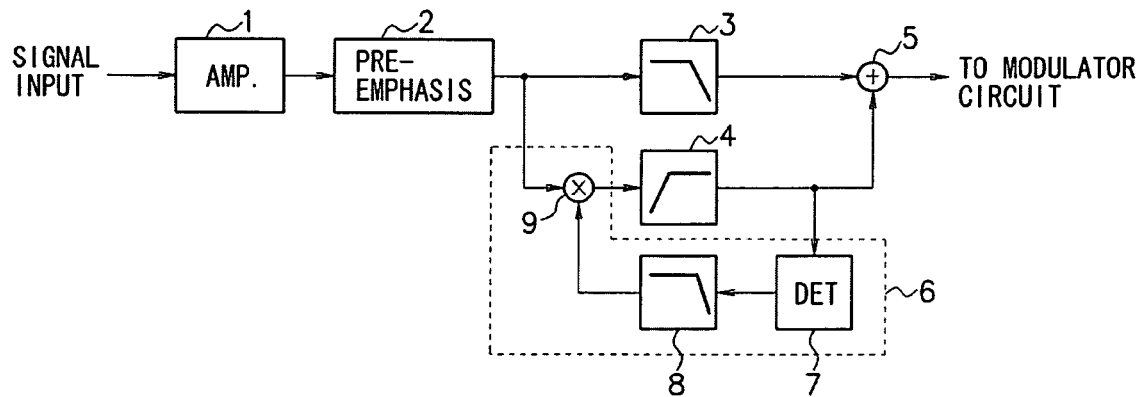
FIG. 3 is a view illustrating an exemplary configuration of a baseband processing circuit in which a harmonic suppressing circuit according to the present invention is used.

An embodiment of the present invention will be described below with reference to the drawings. FIG. 3 is a view illustrating an exemplary configuration of a baseband processing circuit in which a harmonic suppressing circuit according to the present invention is used. Referring to FIG. 3, an amplifier 1 amplifies an input signal. A pre-emphasis circuit 2 emphasizes the modulation degree of the high frequency components of the frequency band of a signal received from the amplifier 1; that is, the circuit 2 emphasizes the signals inputted from the amplifier 101 as the frequency at the frequency band to be converted becomes higher.

A low-pass filter (LPF) 3 and a high-pass filter (HPF) 4 are connected in parallel to the output of the pre-emphasis circuit 2. The cutoff frequency of the LPF 3 is set to about 3 KHz, for example; and its out-of-band attenuation is set to −6 [dB/Oct], for example. The cutoff frequency of the HPF 4 is set to about 3 KHz, for example; and its out-of-band attenuation is set to −12 [dB/Oct], for example. An adder circuit 5 adds a signal outputted from LPF 3 and a signal outputted from HPF 4 and outputs the resultant signal to a rear-stage modulation circuit (not illustrated).

According to the present embodiment, there is included a gain adjusting circuit 6 for the HPF 4. The gain adjusting circuit 6 performs gain adjustment so that the gain of the higher part of the frequency band components to be passed through the HPF 4 is low while the gain of the lower part of the frequency band components thereof is high. In order to perform such gain adjustment, the gain adjusting circuit 6 includes: a detector circuit 7 that detects DC voltage proportional to the level of signal, outputted from the HPF 4; a smoothing LPF 8 that is connected to the output of the detector circuit 7; and a mixer circuit 9 that mixes a signal outputted from the pre-emphasis circuit 2 and a signal outputted from the smoothing LPF 8. Here, in order to eliminate AC components, the cutoff frequency of the smoothing LPF 8 is set to several Hz, for example.

With the above configuration, of the baseband signal outputted from the pre-emphasis circuit 2, the low frequency components of the frequency band pass through the LPF 3, and the high frequency components of the frequency band pass through the HPF 4. Accordingly, all the components of the frequency band needed for the baseband signal before frequency modulation pass through the LPF 3 and HPF 4. In this case, gain adjustment is applied to the HPF 4, and the gain of especially the higher part of the frequency band components passing through the HPF 4 is suppressed by the smoothing LPF 8.

Figure 4:
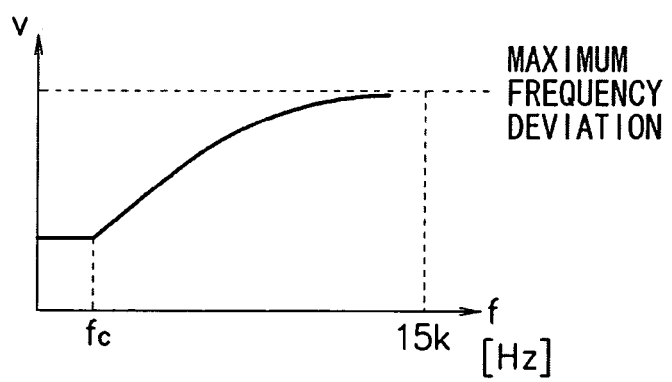
FIG. 4 is a view illustrating the baseband signal frequency characteristics according to the present embodiment.

As a result, the baseband signal outputted from the adder circuit 5 has frequency characteristics illustrated in FIG. 4. Referring to FIG. 4, when the time constant of emphasis is τ, cutoff frequency fc is expressed as ½πτ. Here, time constant τ can be set to 50 μs or 75 μs, for example.

As evident from FIG. 4, according to the present embodiment, the peak value of baseband signal can be prevented from exceeding the maximum frequency deviation without using a limiter as with the related art, so it is possible to effectively suppress occurrence of harmonics. Further, the amplitude of baseband signal is suppressed not over the entire frequency range thereof but only for the high frequency range, so it is also possible to avoid the inconvenience of lowering the level of signal over the entire frequency range. Further, according to the present embodiment, since there is no need to use a LPF having a precipitous cutoff characteristic, it is also possible to suppress occurrence of group delay.

Here, the values of cutoff frequency and out-of-band attenuation of the filters described, in the above embodiment are only exemplary and not limited thereto.

In the above embodiment, there was described the circuit that processes analog signals. However, an A/D converter may be provided at the rear stage of the amplifier 1, so that the subsequent circuit may be constituted using a digital signal processing circuit.

The above-described embodiment is merely exemplary of the present invention, and are not be construed to limit the technical scope of the present invention. That is, many modifications to the embodiment described above are possible without departing from the spirit or main features of the invention.

INDUSTRIAL APPLICABILITY

The harmonic suppressing circuit of the present invention is useful for a frequency modulator that varies the frequency of high frequency signal in proportion to baseband signal to thereby perform frequency modulation, or for an application circuit such as an FM transmitter that is constituted using the frequency modulator.

The invention claimed is:

1. A harmonic suppressing circuit, comprising:
   a pre-emphasis circuit that emphasizes the modulation degree of the high frequency components of the frequency band of an input signal;
   a low-pass filter that is connected to the output of the pre-emphasis circuit;
   a high-pass filter that is connected to the output of the pre-emphasis circuit in parallel to the low-pass filter;
   an adder circuit that adds a signal outputted from the low-pass filter and a signal outputted from the high-pass filter and outputs the resultant signal; and
   a gain adjusting circuit that performs gain a gain of a higher frequency part of the frequency band components to be passed through the high-pass filter is low while a gain of a lower frequency part thereof is high.

* * * * *